(12) United States Patent
Krishna Mohan et al.

(10) Patent No.: US 8,887,109 B1
(45) Date of Patent: Nov. 11, 2014

(54) SEQUENTIAL LOGIC SENSITIZATION FROM STRUCTURAL DESCRIPTION

(71) Applicant: Synopsys, Inc., Mountain View, CA (US)

(72) Inventors: Srivathsan Krishna Mohan, Mountain View, CA (US); Youming Xu, Shanghai (CN)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/897,184

(22) Filed: May 17, 2013

(51) Int. Cl.
*G06F 17/50* (2006.01)
*G01R 31/3183* (2006.01)

(52) U.S. Cl.
CPC ................................. *G01R 31/3183* (2013.01)
USPC ............................. 716/101; 716/108; 716/110

(58) Field of Classification Search
USPC .......................................... 716/101, 108, 110
See application file for complete search history.

(56) References Cited

U.S. PATENT DOCUMENTS

| | | | | |
|---|---|---|---|---|
| 5,355,321 A | * | 10/1994 | Grodstein et al. | 716/108 |
| 5,450,414 A | * | 9/1995 | Lin | 714/726 |
| 5,655,109 A | | 8/1997 | Hamid | |
| 5,796,621 A | * | 8/1998 | Dudley et al. | 716/103 |
| 6,044,211 A | * | 3/2000 | Jain | 716/102 |
| 6,360,191 B1 | * | 3/2002 | Koza et al. | 703/6 |
| 6,449,745 B1 | * | 9/2002 | Kim et al. | 714/739 |
| 6,587,844 B1 | * | 7/2003 | Mohri | 706/20 |
| 7,000,202 B1 | | 2/2006 | Srinivasan et al. | |
| 7,017,043 B1 | * | 3/2006 | Potkonjak | 713/176 |
| 7,076,416 B2 | * | 7/2006 | Chen et al. | 703/15 |
| 7,143,021 B1 | * | 11/2006 | McGaughy et al. | 703/14 |
| 7,180,328 B2 | * | 2/2007 | Gould et al. | 326/46 |
| 7,246,331 B2 | * | 7/2007 | Ward | 716/106 |
| 7,337,418 B2 | * | 2/2008 | Kale et al. | 716/106 |
| 7,779,393 B1 | * | 8/2010 | Manovit et al. | 717/132 |
| 8,028,260 B1 | * | 9/2011 | Ravi | 716/113 |
| 8,255,854 B2 | * | 8/2012 | Zhu et al. | 716/117 |
| 8,347,250 B2 | * | 1/2013 | Gonzalez et al. | 716/114 |
| 8,615,727 B2 | * | 12/2013 | Ghanta et al. | 716/134 |
| 2003/0105617 A1 | * | 6/2003 | Cadambi et al. | 703/14 |

* cited by examiner

*Primary Examiner* — Naum B Levin
(74) *Attorney, Agent, or Firm* — Bever, Hoffman & Harms, LLP

(57) ABSTRACT

A method of sensitizing a sequential circuit is described. This sensitizing generates stimuli to drive any circuit output to a predetermined value or transition. The method includes creating a directed graph of the sequential circuit. Nodes of the graphs can be topologically sorted. In one embodiment, feedback loops in the directed graph can be removed before topologically sorting the nodes. Final vectors for the sequential circuit can be generated based on the sorted nodes. Notably, the final vectors are expressed only by primary inputs to the sequential circuit. Using only primary inputs in the final vectors accurately replicates the sequential circuit under test, thereby ensuring accurate timing, power, and noise arcs are measured.

30 Claims, 11 Drawing Sheets

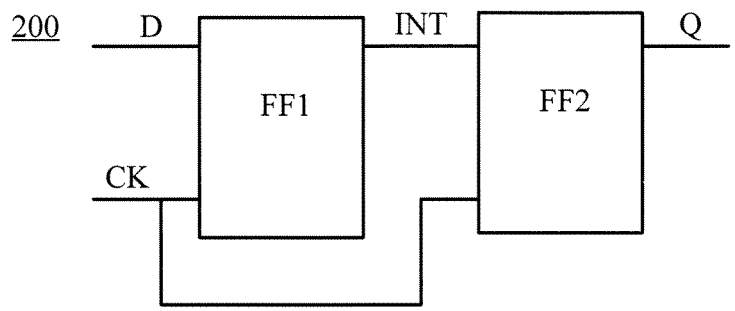
Figure 2
```
                                          300
    ff (INT) {
        next_state: D ;
        clocked_on: CK ;
    }
    ff (Q) {
        next_state: INT ;
        clocked_on: CK ;
    }
```
Figure 3
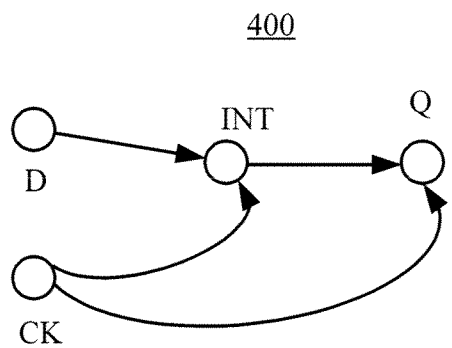
Figure 4

Initial vectors 601 for INT node (FF1)

CK = 01, D = 0, INT = 0
CK = 01, D = 1, INT = 1

Figure 6A

Initial vectors 602 for Q node (FF2)

CK = 01, INT = 0, Q = 0
CK = 01, INT = 1, Q = 1

Figure 6B

Intermediate vectors 603 for INT node (FF1)

CK = 01101, D = 00111, INT = X0001
CK = 01101, D = 11000, INT = X0010

Figure 6C

Intermediate vectors 604 for Q node (FF2)

CK = 01101, INT = 00111, Q = X0001
CK = 01101, INT = 11000, Q = X0010

Figure 6D

SEQUENTIAL LOGIC SENSITIZATION FROM STRUCTURAL DESCRIPTION

RELATED ART

Characterization of a circuit under test involves the generation of timing, power, and noise models usable in a standard design flow. Generation of these models requires creating arcs (i.e. predetermined relationships between inputs and outputs of the models) and their input stimulus for usage during SPICE simulation. These arcs can include timing (i.e. delay and constraint), power, and noise arcs. The process of generating the input stimulus for the arcs is referred to as sensitization herein. The generated input stimuli drive model outputs to predetermined values or transitions.

In the case of combinational logic, sensitizing an output with respect to an input involves taking the Boolean difference of the output function with respect to the input. For example, a logic zero input will always drive the output of an AND gate to a logic zero. In contrast, a logic one input will always drive the output of an OR gate to a logic one. However, in the case of sequential logic, propagating an input to output requires careful application of both the synchronous signals (e.g. the clock) and the asynchronous signals (e.g. clear, preset, etc.), after setting internal memory nodes to their required states.

As complex systems-on-chips (SOCs) are designed, multistage sequential logic (e.g. synchronizers, retention cells, shift-registers, and flip-flops/latches) with test logic, level-sensitive scan design (LSSD), etc. are being added to standard cell libraries to achieve better system integration. For such sequential cells, generating exhaustive timing arcs, power arcs, and their stimuli is a non-trivial task.

Techniques for generating these arcs and stimuli have significant shortcomings. For example, one automated technique traces the sequential circuit, identifies the internal memory nodes of the sequential circuit, and then applies inputs to those internal memory nodes to characterize the circuit under test. Unfortunately, identifying all internal memory nodes and hence initializing them to required logic state in complex sequential circuits is difficult, thereby contributing to inaccuracy. In other instances, these internal memory nodes are characterized as being driven by ideal voltage source, which is generally not the case, thereby once again contributing to inaccuracy. Yet further, because one or more internal nodes may not be initialized to the values that would happen during actual operation, this technique could lead to incorrect timing and power values.

In another automated technique, the sequential circuit is broken up into basic building blocks, i.e. "strongly-connected components" (SCCs). These SCCs for a sequential circuit could be latches or flip-flops. Each SCC is then characterized separately to generate its output waveform. At this point, each output waveform is provided as an input to its downstream SCC, thereby creating a propagated waveform. Delays between SCCs are characterized as loadings. This automated technique can improve accuracy compared to the above-described manual technique, but requires significant storage resources for storing all the waveforms and loadings. Notably, even with the improved accuracy, the actual operation of many complex sequential circuits still deviates from the SCC-based simulations.

Therefore, a need arises for an accurate, automatic sensitization technique for sequential circuits.

SUMMARY

A method of sensitizing a sequential circuit is described. This sensitizing generates stimuli to drive any circuit output to a predetermined value or transition. The method includes creating a directed graph of the sequential circuit. Nodes of the graphs can be topologically sorted. In one embodiment, feedback loops in the directed graph can be removed before topologically sorting the nodes. Final vectors for the sequential circuit can be generated based on the sorted nodes. Notably, the final vectors are expressed only by primary inputs to the sequential circuit. Using only primary inputs in the final vectors accurately replicates the sequential circuit under test, thereby ensuring accurate timing, power, and noise models are generated.

Generating the final vectors can include storing intermediate vectors for the nodes of the directed graph. At least one intermediate vector is expressed by an internal node. Topologically sorting can include determining a level for each node. In one embodiment, when a node level is one, then its intermediate vector can be stored as its final vector. An iteration between input transitions to determine bit sequencing can be performed over each intermediate vector of each node of node level two and higher. Performing the iteration can include ordering inputs in ascending order based on last transitioning bits. Stored intermediate vectors can be replaced with the final vectors, which were computed based on the iteration.

A non-transitory, computer-readable medium storing computer-executable instructions for sensitizing a sequential circuit is also described. These instructions when executed by a computer cause the computer to execute a process comprising the above steps. An electronic design automation (EDA) tool including program instructions for sensitizing a sequential circuit is also described. These program instructions perform a process comprising the above steps.

BRIEF DESCRIPTION OF THE DRAWINGS

FIG. 2 illustrates an exemplary sequential circuit having two sequentially-connected flip-flops.

FIG. 3 illustrates a structural description corresponding to the sequential circuit of FIG. 2.

FIG. 4 illustrates a directed graph that can be created from the structural description of FIG. 3.

FIG. 6A illustrates exemplary initial vectors for node INT of FIG. 2.

FIG. 6B illustrates exemplary initial vectors for node Q of FIG. 2.

FIG. 6C illustrates the intermediate vectors for the INT node of FIG. 2.

FIG. 6D illustrates the intermediate vectors for the Q node of FIG. 2.

DETAILED DESCRIPTION OF THE DRAWINGS

In accordance with an improved sensitization technique, only primary inputs are used to set the internal nodes and then drive the output to the required final state. This technique can accurately replicate a circuit under test operation in a chip and ensure accurate timing, power, and noise values.

In general, to generate a timing model of a cell, bitstreams (each bitstream comprising a predetermined series of logic zeros and logic ones) are provided to drive the primary inputs of the cell. For example, for a D-type rising edge-triggered flip-flop, the following bitstreams could be provided to the clock (CK) and data (D) input terminals.

CK 01101101
D 11000111

For a rising edge-triggered D-type flip-flop, its output from the Q terminal is updated (i.e. the value stored on its D terminal is transferred to its Q terminal) only after a rising CK, i.e. CK transitioning from logic zero to logic one. A simulator, such as a SPICE simulator, can run these bitstreams to determine the output (Q and Q') waveforms.

Note that although the sensitization of a flip-flop (as described above) is straight forward, complex sequential circuits having multiple stages can provide significant challenges for sensitization. Therefore, the goal of a primary input sensitization technique is to create a correct set of primary inputs (i.e. predetermined bitstreams) to generate the desired outputs.

Figure 1:
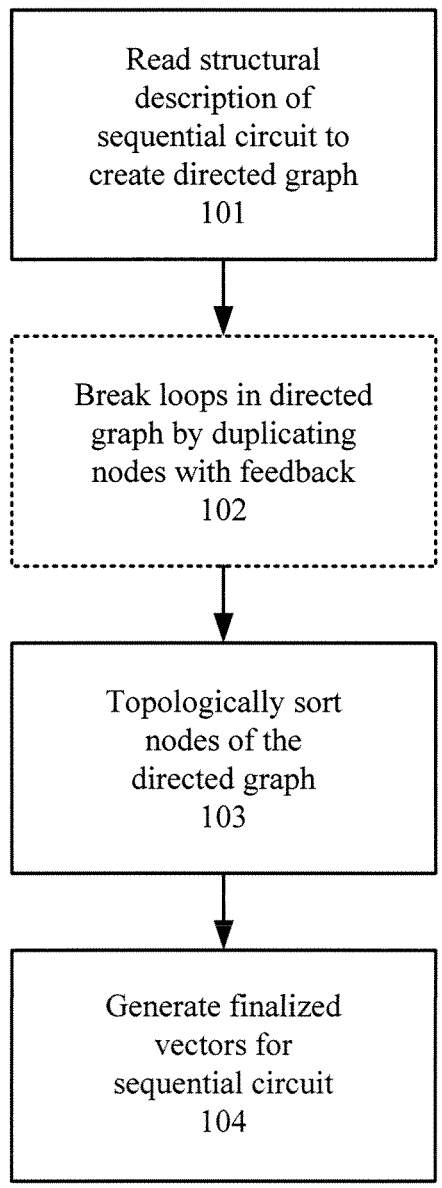
FIG. 1 illustrates an exemplary primary input sensitization technique.

FIG. 1 illustrates an exemplary primary input sensitization technique 100. In step 101, the structural description of a sequential component described using primitives, can be read to create one or more directed graphs. FIG. 2 illustrates an exemplary sequential circuit 200 having two sequentially-connected flip-flops FF1 and FF2. Note that the steps and principles described in reference to this sequential circuit apply equally to a sequential circuit having any number of primitives therein. FIG. 3 illustrates a structural description 300 corresponding to sequential circuit 200. In one embodiment, the structural descriptions may conform to the Liberty standard (which is a widely-used open source library modeling standard supported by the semiconductor and electronic design automation vendor communities).

FIG. 4 illustrates a directed graph 400 that can be created from structural description 300. Notably, each primary input, internal (INT) node, and output of structural description 300 is designated a node (also called a pin herein) with a logical node name. Note that the internal nodes may or may not be internal memory nodes (although for sequential circuit 200, INT is in fact an internal memory node). In one embodiment, directed graph 400 indicates data flow between pins by arrows, thereby essentially creating a data structure. Directed graph 400 can be stored for use in steps 102 and 103 (FIG. 1).

In one embodiment, step 102 can include breaking loops by duplicating any nodes with feedback. Note that when the sequential circuit, such as sequential circuit 200 includes no feedback, step 102 is not performed. Therefore, step 102 may be characterized as optional. Step 102 is described in further detail below with respect to FIGS. 8A, 8B, 9A, and 9B.

In step 103, the nodes of the directed graph can be topographically sorted. In one embodiment, this topographical sorting can be performed based on the "distance" from the primary inputs. Note that in this case, the distance is not a physical distance, but a data flow distance. For example, referring to FIG. 4, nodes D and CK are primary inputs and therefore have a distance of "0" from themselves. Node INT receives data from nodes D and CK. For a node having multiple inputs, the data flow distance for that node is the greatest distance of any input node incremented by one. Therefore, node INT has a distance of "1" ("0" (of D or CK)+1). Node Q receives data from both node INT and node CK. Therefore, the data flow distance for node Q is "2" (i.e. "1" (the distance of INT, which is greater than the distance of CK)+1).

Figure 5:
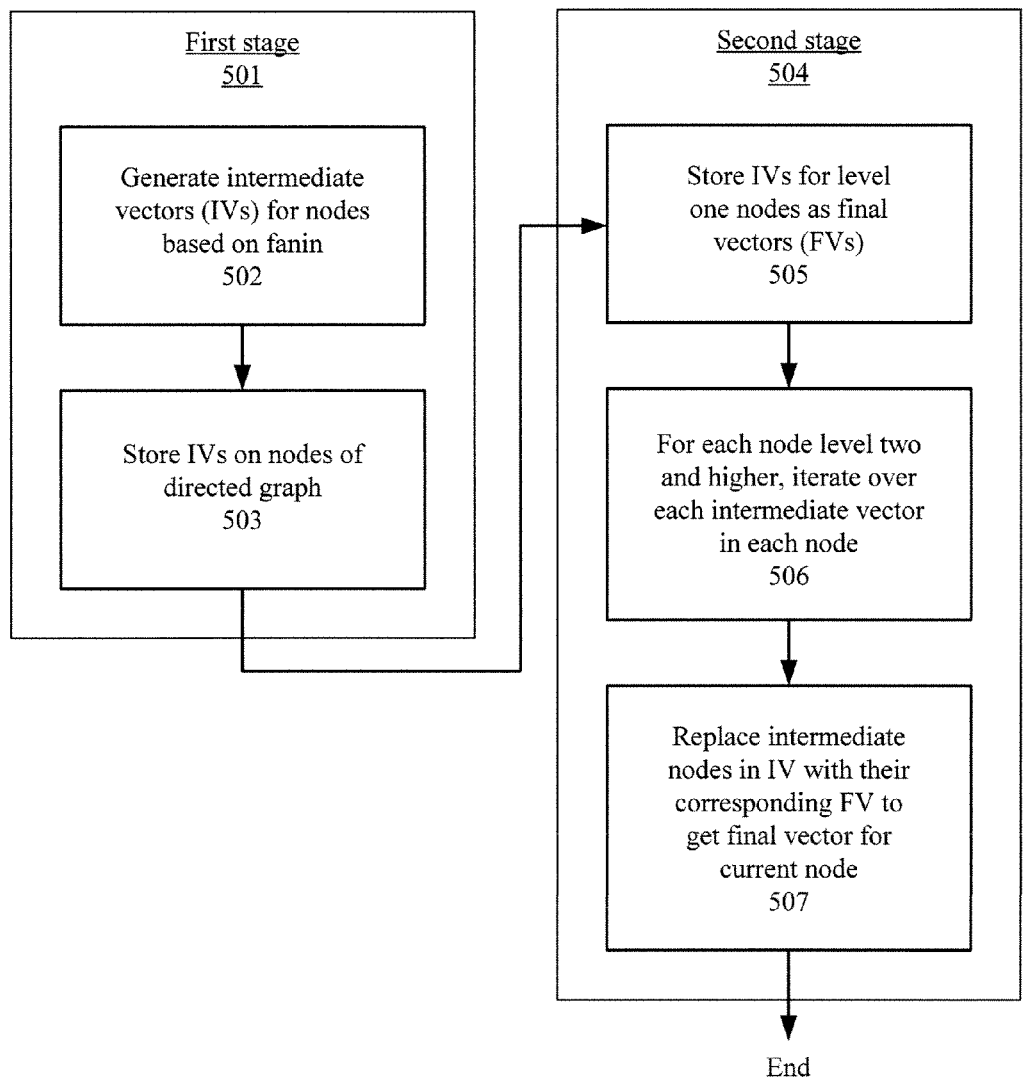
FIG. 5 illustrates an exemplary technique for generating the final vectors for nodes at any level.

After topological sorting, in step 104 (FIG. 1), the final vectors can be generated for the sequential circuit. FIG. 5 illustrates an exemplary technique for generating the final vectors. In one embodiment, this technique can include a first stage 501 and a second stage 504. In first stage 501, each node can be sensitized with its current fanin (i.e. its input nodes) in step 502. That is, intermediate vectors for each node can be generated based on that node's fanin. In step 503, intermediate vectors generated in step 502 are then stored on a set of nodes of the directed graph. In one embodiment, the set of nodes includes all of the nodes of the sequential circuit except the nodes corresponding to primary input nodes. In another embodiment, the set of nodes includes at least a plurality of nodes of the sequential circuit, once again with the exception of the nodes corresponding to primary input nodes.

FIG. 6A illustrates exemplary initial vectors for node INT. As shown, the initial intermediate vectors indicate the sensitization for a specific output of the primitive FF1. As noted above, for a D-type flip-flop like FF1, its output is updated (i.e. the value stored on its D terminal is transferred to its Q terminal) only after a rising CK, i.e. CK transitioning from logic zero to logic one. Therefore, two initial vectors are sufficient to sensitize the INT node for its two specific outputs, i.e. one vector in which D is a logic 0 (top line) and another vector in which D is a logic 1 (bottom line). Note that node Q is also a D-type flip-flop (FF2) and therefore has a similar set of initial vectors, as shown in FIG. 6B (wherein INT is an input to the Q node).

In accordance with one feature of the sensitization process, the transition of the outputs (i.e. from logic zero to logic one and vice versa) are taken into account when generating the intermediate vectors. In one embodiment, to ensure timing, power, and noise accuracy, only one input is allowed to transition at any time. FIG. 6C illustrates the intermediate vectors for the INT node when its outputs transition from "0" to "1" as well as from "1" to "0". Note that to accomplish each transition while conforming to the input condition that only one input is allowed to transition at any time, a bitstream of five bits is need. Referring to the first transition of the INT node (01) (top line in FIG. 6C) and assuming that input D is "0", input CK transitions between the first and second bits and therefore input D remains at the same value, i.e. "0". Input D transitions between the second and third bits and therefore input CK remains at the same value, i.e. "1". Because only a rising edge triggers the input to be output by the D-type flip-flop, input CK must transition back to "0", then to "1" for input D of "1" to be output at INT. Therefore, the third through the fourth bits of D remain at the same value, i.e. "1". Note that the INT node has an unknown value (X) for the first time period (of the five time periods associated with the intermediate vector), but then has known binary values thereafter (controlled by the values on the D node when a rising edge occurs on the CK node).

Referring to the second transition of the INT node (10) (bottom line in FIG. 6C), input CK transitions between the first and second bits and therefore input D remains at the same value, i.e. 1. Input D transitions between the second and third bits and therefore input CK remains at the same value, i.e. 1. As explained above, because only a rising edge triggers the input to be output by the D-type flip-flop, input CK must transition back to "0", then to "1" for input D to be output at INT. Therefore, the third through the fourth bits of D remain at the same value, i.e. "0". Thus, as shown in FIG. 6C, the two bitstreams for inputs CK and D provide the desired transitions of output INT. The bitstreams shown in FIG. 6C are called intermediate vectors 603. The intermediate vectors 604 for the Q node (FF2) are shown in FIG. 6D.

At this point, the intermediate vectors for each node can be stored at the node in the directed graph. In one embodiment, both the structural description of the node and its intermediate vectors can be stored at the node in the directed graph for the circuit. Storing of at least the intermediate vectors for the nodes completes first stage 501 of FIG. 5.

In second stage 504, some intermediate vectors can be stored as final vectors, which only have primary inputs in step 505. Specifically, because level one nodes have only primary inputs in their fanin, final vectors are available at the end of first stage 501 for level one nodes. In one embodiment, both intermediate and final vectors can be stored at the level one nodes. In another embodiment, only the final vectors are stored at level one nodes.

In step 506, all nodes with internal pins in their fanin, i.e. the level two and higher nodes, are traversed for second stage sensitization. As described in further detail below, this traversal iterates over each intermediate vector in each node at level two and higher to build a final vector for that node.

Figure 7:
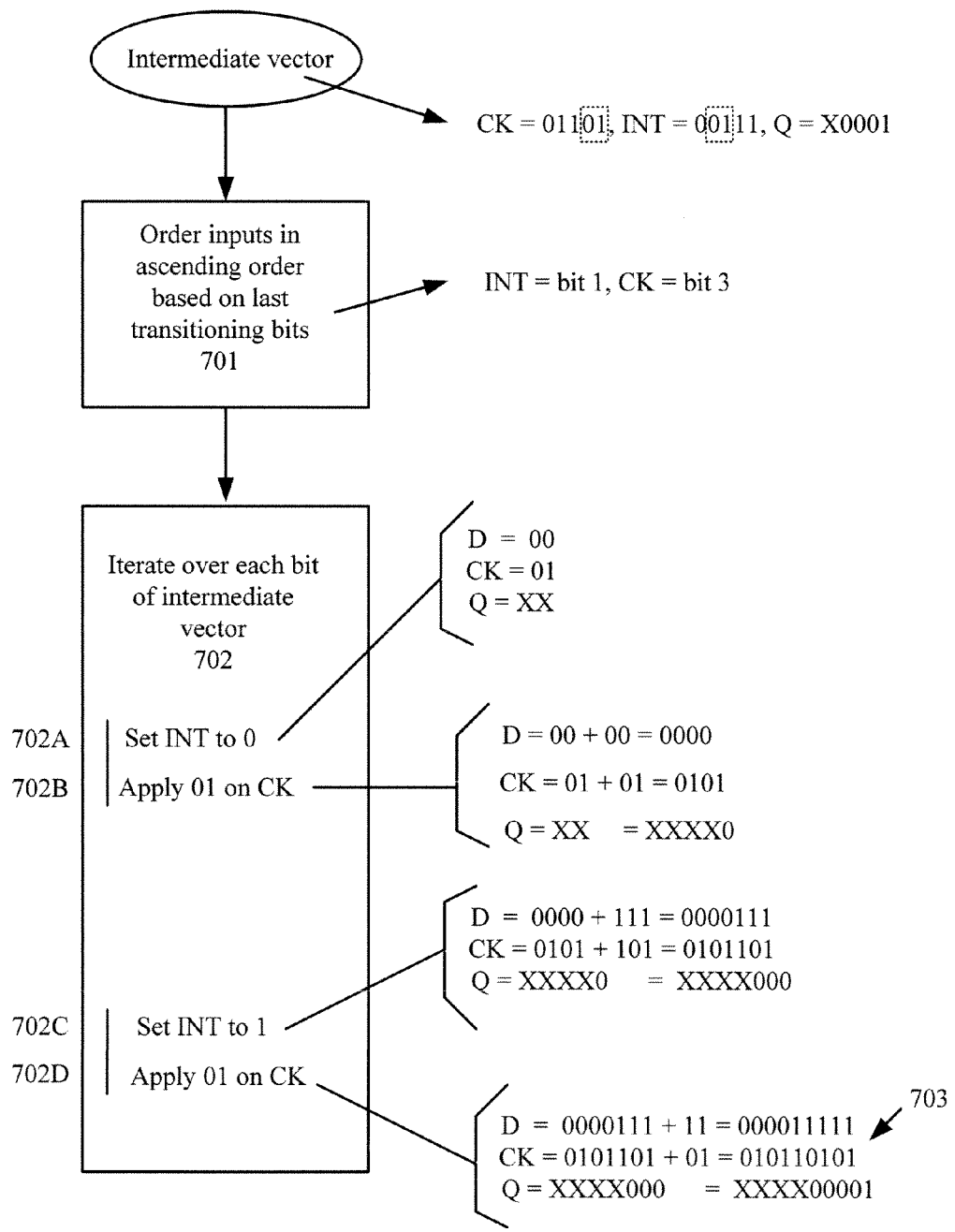
FIG. 7 illustrates a detailed technique for building the final vector for a node at level two and higher.

FIG. 7 illustrates a technique for building the final vector for a node at level two and higher. In step 701, the inputs of that node can be ordered in ascending order based on the last transitioning bits in accordance with the intermediate vector for that node. Referring back to FIG. 2, the only node at level two and higher is the Q node (FF2). FIG. 7 shows the intermediate vector for the Q node as an input to step 701. Referring to that intermediate vector, input CK transitions between bits 3 and 4 (transition start is therefore bit 3), whereas input INT transitions between bits 1 and 2 (transition start is therefore bit 1). Therefore, the ordering performed in step 701 indicates the iteration order for the input nodes during the next step 702. As indicated by step 701, the iteration of step 702 begins with the INT node.

In one embodiment of step 702 (which includes steps 702A-702D), the INT node is first set to "0". As indicated by the appropriate initial vector for the INT node (i.e. the top initial vector of initial vectors 601, FIG. 6A) (and partially shown in FIG. 7 for convenience), setting INT to "0" in step 702A requires a rising edge CK=01 and D=00. Note that this results in Q=XX (i.e. unknown values). To ensure that these INT values are propagated to the Q node, in step 702B, an additional rising edge (01) is applied on node CK. Then the input bit sequences of steps 702A and 702B are combined. Thus, D=00+00=0000; CK=01+01=0101; and Q=XXXX0 (wherein Q is shown for convenience).

As part of the iteration of step 702, the INT node is then set to the other logic value (in this case, "1"). As indicated by the appropriate initial vector for the INT node (i.e. the bottom initial vector of initial vectors 601, FIG. 6A) (not shown in FIG. 7 for simplicity), setting INT to "1" in step 702C requires a rising edge CK=01 and D=11. In one embodiment, the condition that only one input node transitions at any time applies to the bit sequencing of steps 702A-702D. Therefore, in step 702C, an additional bit is required because D is transitioning from "0" to "1". Thus, CK=101 and D=111. These bit sequences are combined with those generated in step 702B. Thus, D=0000+00=0000111; CK=0101+101=0101101; and Q=XXXX000.

Once again, to ensure that these INT values are propagated to the Q node, in step 702D, an additional rising edge (01) is applied on node CK. The input bit sequences of steps 702C and 702D are combined as shown in FIG. 7. Thus, D=0000111+11=000011111, CK=0101101+01=0110101, and Q=XXXX00001.

As shown in FIG. 7, the final vectors 703 for nodes D and CK result in a transition (01) on node Q. A transition (10) on node Q can be obtained by performing steps 702C and 702D before steps 702A and 702B. However, the selected transition should be consistent between nodes during sensitization. That is, if a transition (10) is selected for the first node sensitized, then all subsequent nodes should use the same transition during sensitization. Final vectors 703 can be stored at the Q node in step 507. In one preferred embodiment, the initial and intermediate vectors can be replaced by the final vectors in step 507. Notably, the final vectors are expressed in terms of D and CK, which are primary inputs.

As indicated by steps 506 and 507, the iteration and storing is performed for each node level two and higher. In one embodiment, performing steps 506 and 507 for one node can be complete before performing the same steps for another node (thereby forming a loop between steps 506 and 507). In one embodiment, iteration begins with the node closest to the input (e.g. the D node) and ends with the node closest to the output (e.g. the Q node) in accordance with the node sorting performed in step 103 (FIG. 1). Note that the generating and storing of intermediate vectors in first stage 501 and the generating and storing of final vectors in second stage 502 is conceptual only. That is, steps 502, 503, and 505-507 can also be characterized as being performed in one stage or in any number of stages. However, note that the steps in first stage 501 can be performed in parallel for each node, whereas the steps in second stage 504, in particular steps 506 and 507, should be serially performed in accordance with the above-described node sorting.

Figure 8A:
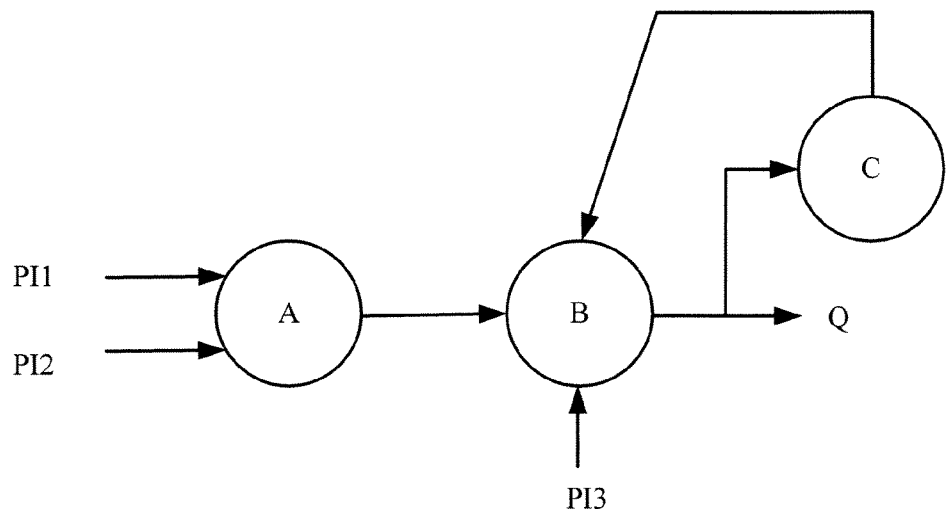
FIGS. 8A, 8B, 9A, and 9B illustrate techniques for removing feedback loops.
Figure 8B:
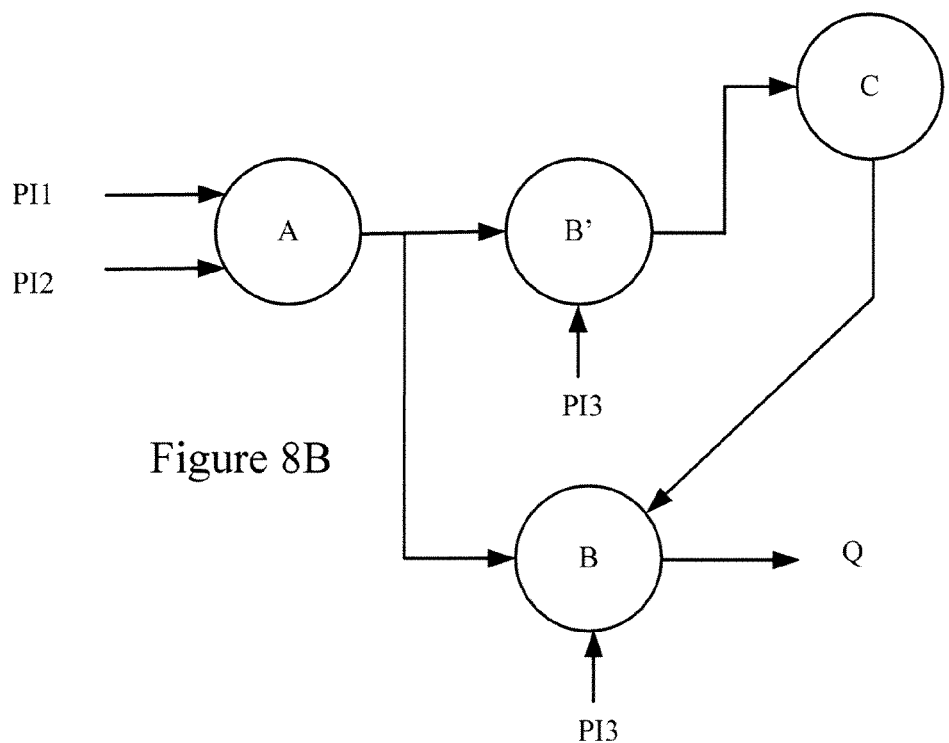

In one embodiment, and referring back to FIG. 1, any loops in the directed graph can be broken by duplicating the nodes associated with the feedback. For example, FIG. 8A illustrates an exemplary circuit having three, serially-connected primitives A, B, and C. Primitive A receives two primary inputs PI1 and PI2, and primitive B receives one primary input PI3 and generates the circuit output Q. Primitive C receives the Q output and generates a feedback that is provided to primitive B as an input. FIG. 8B illustrates one technique for removing the feedback loop. In this technique, the primitive that receives the feedback, i.e. primitive B, is duplicated, thereby creating primitive B'. Both primitives B and B' receive the primary input PI3 as well as the output of primitive A (which still receives primary inputs PI1 and PI2). Primitive C receives its input from B' and generates an output, which is provided to primitive B. Primitive B generates the circuit output Q. In this configuration, primitive B' represents the previous state and primitive B represents the current state. Previous state node B' does not have feedback path in its input, while current state node B has the same functionality as original node B in FIG. 8A with previous state node B' in its fanin cone. Thus, the configurations of FIGS. 8A and 8B have the same logic function, but the configuration of FIG. 8B does not include a feedback loop. Once the feedback loop is removed, i.e. the configuration of FIG. 8B is generated, then primary input sensitization technique 100 can proceed as described above by, for example, creating nodes A, B, B', and C, as well as nodes PI1, PI2, PI3, and Q.

Figure 9A:
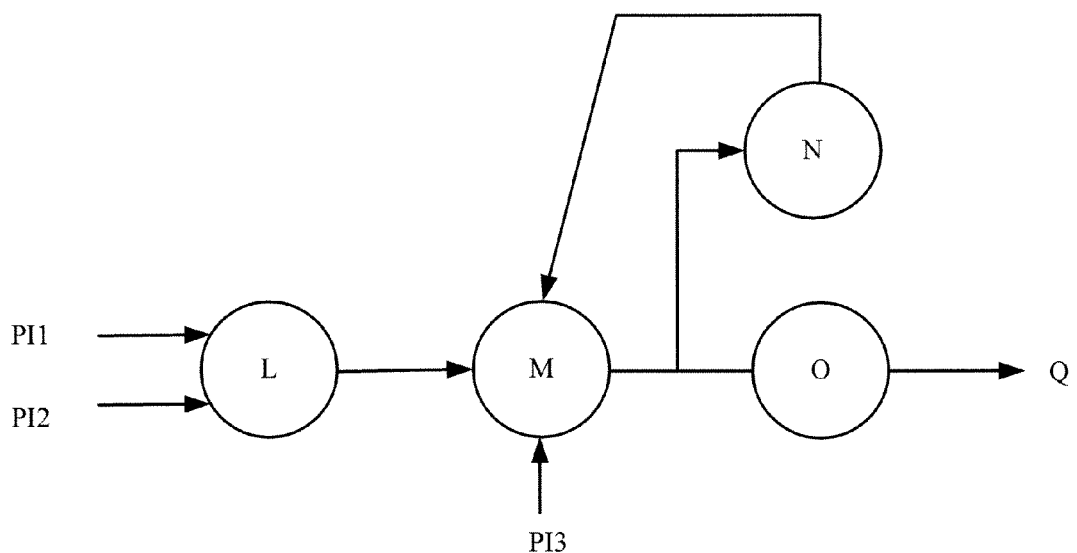
Figure 9B:
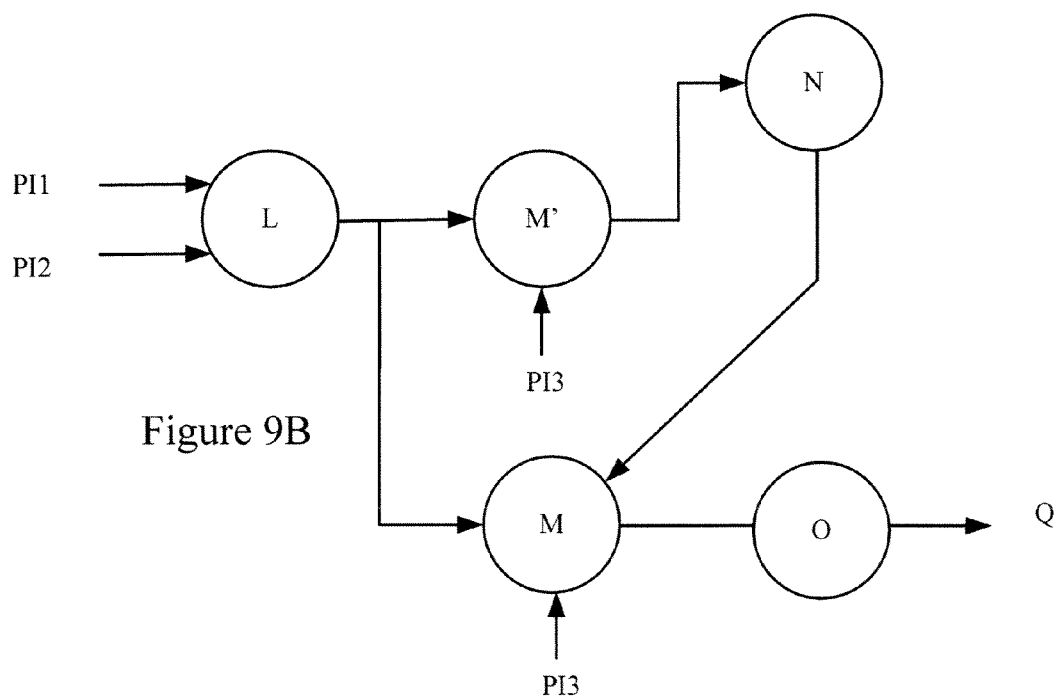

FIGS. 9A and 9B illustrate another exemplary circuit with and without a feedback loop, respectively. In FIG. 9A, the exemplary circuit has four primitives L, M, N, and O. Primitive L receives two primary inputs PI1 and PI2, and primitive M receives one primary input PI3 and the output of primitive L. Primitives N and O receive the output of primitive M. Primitive N generates a feedback for primitive M, whereas primitive O generates the circuit output Q. FIG. 9B illustrates one technique for removing the feedback loop from primitive N. In this technique, the primitive that receives the feedback, i.e. primitive M, is duplicated, thereby creating primitive M'. Both primitives M and M' receive the primary input PI3 as well as the output of primitive L (which still receives primary inputs PI1 and PI2). Primitive N receives its input from M' and generates an output, which is provided to primitive M. Primitive O continues to receive the output of primitive M and generate the circuit output Q. Once again, the configurations of FIGS. 9A and 9B have the same logic function, but the configuration of FIG. 9B does not include a feedback loop. Once the feedback loop is removed, i.e. the configuration of FIG. 9B is generated, then primary input sensitization technique 100 can proceed as described above by, for example, creating nodes L, M, M', N, and O, as well as nodes PI1, PI2, PI3, and Q.

Figure 10:
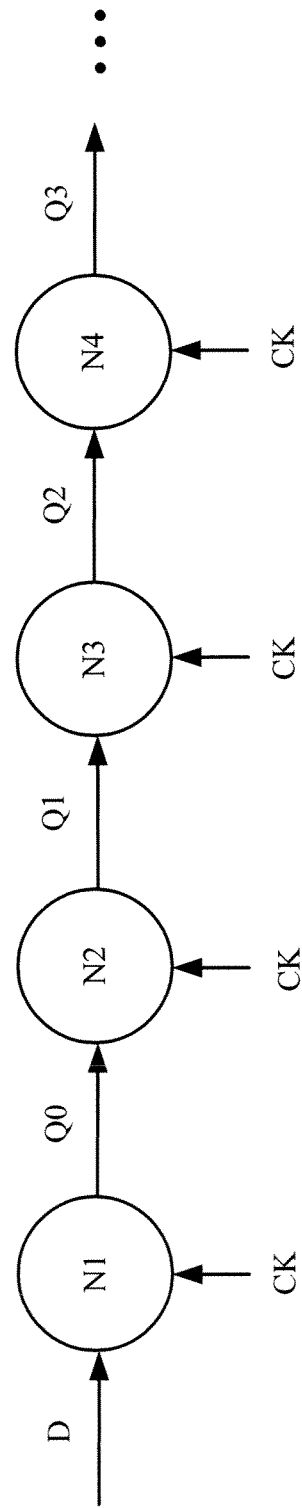
FIG. 10 illustrates that any number of nodes can be sensitized using the primary input sensitization technique.

FIG. 10 illustrates that any number of nodes can be sensitized using primary input sensitization technique 100. In the configuration shown in FIG. 10, nodes N1-N4 (e.g. representing D flip-flops) are shown, but additional nodes may be part of the configuration. Note further that nodes N1-N4 may be characterized as generating external outputs Q0-Q3; however, outputs Q0-Q2 can be processed as internal nodes in technique 100. That is, primary input sensitization technique 100 allows complete flexibility in characterizing primitives and their outputs as constituting a single circuit or as multiple circuits. For example, primary input sensitization technique 100 allows nodes N1-N4 to be characterized as a circuit, wherein Q0-Q2 are internal nodes and Q3 is an output node. Alternatively, nodes N1-N2 could be characterized as one circuit and nodes N3 and N4 could be characterized as another circuit (each circuit having specific internal nodes and external output nodes). Notably, as discussed above, some analysis of nodes N1-N4 can be done in parallel (e.g. using multiple processors), while other analysis should be done in series. Specifically, determining the intermediate vectors for the nodes can be performed in parallel; however, determining the final vectors should be performed in series. For example, to determine the final vector of N2, the final vector of Q0 (and thus also of N1) should be available to accurately account for its input to node N2.

Figure 11:
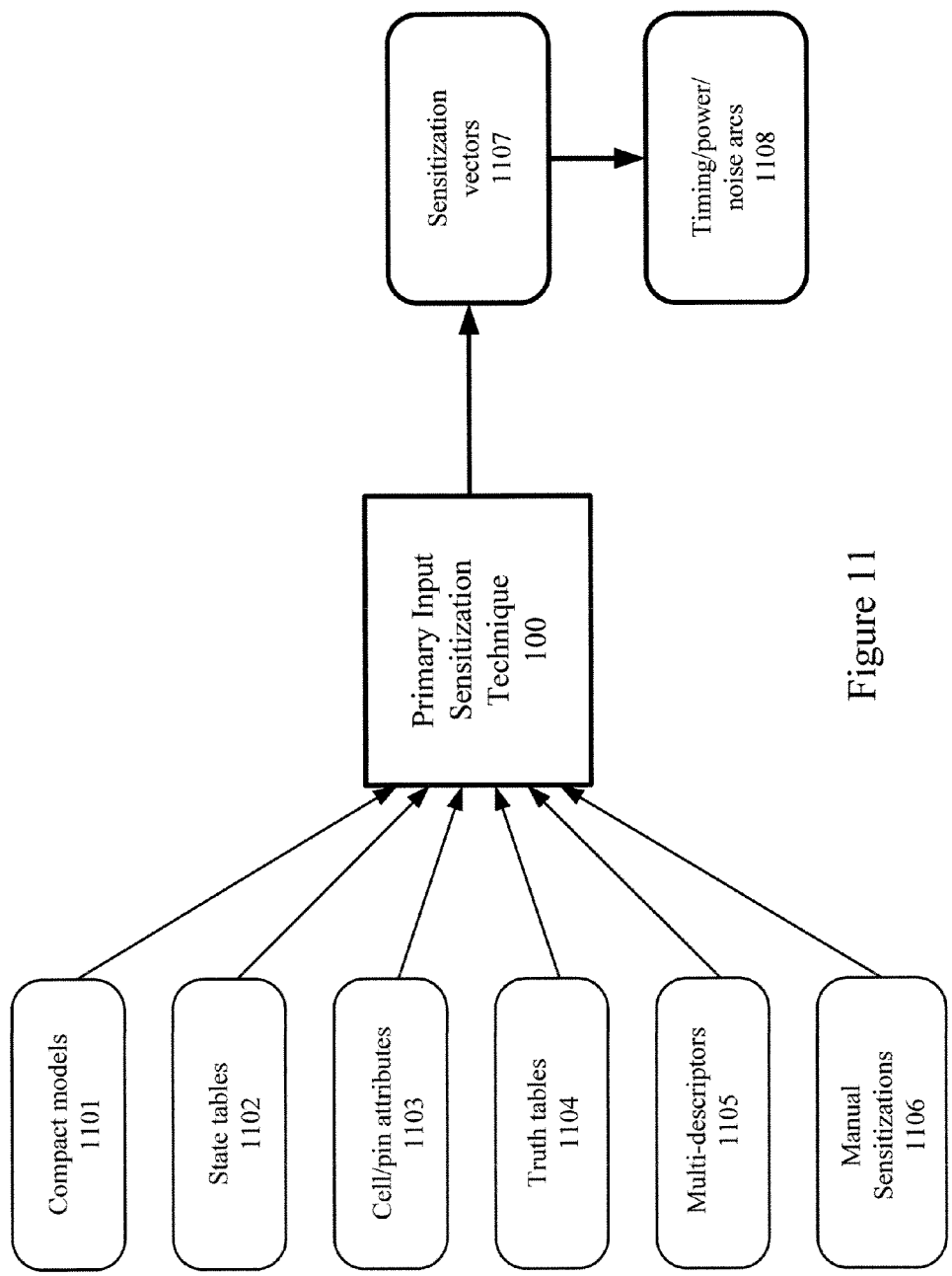
FIG. 11 illustrates an overview of the syntax for the primary input sensitization technique.

FIG. 11 illustrates an overview of the syntax for primary input sensitization technique 100. In one embodiment, a variety of sources can be used as inputs to primary input sensitization technique 100, i.e. provide the above-described structural description. Some sources, such as compact models 1101, state tables 1102, and/or cell/pin attributes 1103, can be provided by the Liberty library modeling standard, while other sources, such as truth tables 1104 and/or multi-descriptors 1105 can be provided by a proprietary tool. In one embodiment, cell/pin attributes 1103 can also be provided by the proprietary tool. In another embodiment, manual sensitizations 1106 can also be accessed via the proprietary tool. An exemplary proprietary tool is the NCX™ tool licensed by Synopsys, Inc. Primary input sensitization technique 100 outputs final (sensitization) vectors, which in turn can be used to generate arcs of the circuit under test to determine timing, power, and noise values.

Primary input sensitization technique 100 can provide excellent accuracy compared to "golden" values (which are values known to be 100% accurate). This accuracy extends to timing, noise, and power values. Note that when the transitions occur in the nodes, power consumption and/or noise can also be computed. For example, the current that is drawn from a high voltage source VDD can be simulated. This current can then be multiplied by VDD to obtain the power consumption. Note that when nodes are not set to their correct states, they may transition at the wrong time or incompletely, thereby leading to inaccurate power consumption results. Notably, by using the above-described primary input sensitization technique, all nodes are set to their correct states, thereby ensuring that accurate power consumption values are computed.

Figure 12:
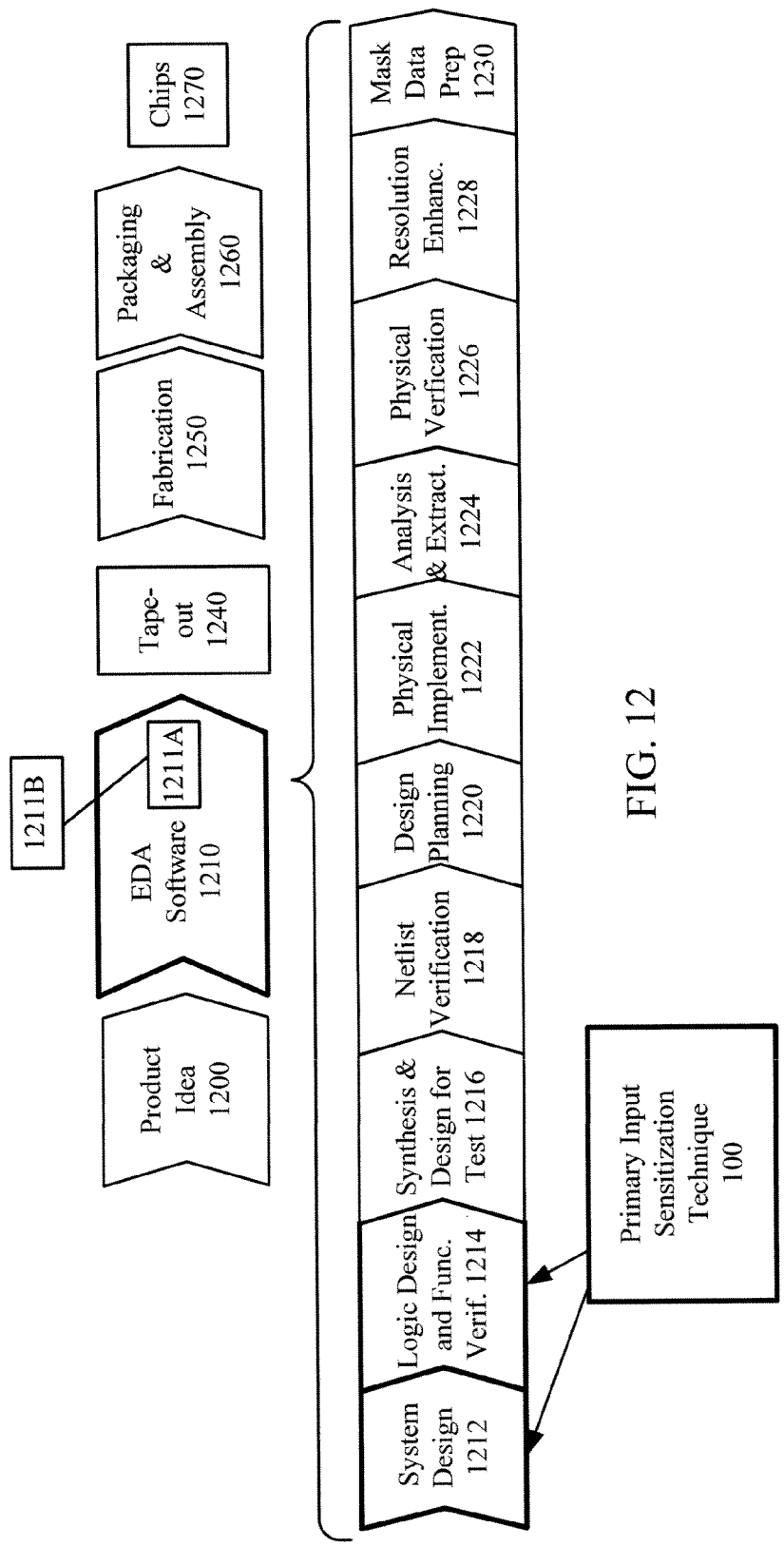
FIG. 12 shows a simplified representation of an exemplary digital ASIC design flow.

FIG. 12 shows a simplified representation of an exemplary digital ASIC design flow. At a high level, the process starts with the product idea (step 1200) and is realized in an EDA software design process (step 1210). When the design is finalized, it can be taped-out (event 1240). After tape out, the fabrication process (step 1250) and packaging and assembly processes (step 1260) occur resulting, ultimately, in finished chips (result 1270).

The EDA software design process (step 1210) is actually composed of a number of steps 1212-1230, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC.

A brief description of the components/steps of the EDA software design process (step 1210) will now be provided. In one embodiment, one or more steps of the EDA software design process can be implemented using a computer-readable medium 1211A, which is read by a computer 1211B. Note that Astro, AstroRail, CustomSim, ESP, Hercules, IC Compiler, Magellan, Model Architect, Power Compiler, PrimeRail, Proteus, ProteusAF, PSMGen, Saber, StarRC, and System Studio are trademarks of Synopsys, Inc., and CATS, DesignWare, Design Compiler, Formality, HSIM, Leda, NanoSim, Primetime, Syndicated, TetraMAX, VCS, and Vera are registered trademarks of Synopsys, Inc.

System design (step 1212): The designers describe the functionality that they want to implement, they can perform what-if planning to refine functionality, check costs, etc. Hardware-software architecture partitioning can occur at this stage. Exemplary EDA software products from Synopsys, Inc. that can be used at this step include Model Architect™, Saber™, System Studio™, and DesignWare® products. In one embodiment, the above-described primary input sensitization technique 100 can be performed in step 1212.

Logic design and functional verification (step 1214): At this stage, the VHDL or Verilog code for modules in the system is written and the design is checked for functional accuracy. More specifically, the design is checked to ensure it generates expected outputs. Exemplary EDA software products from Synopsys, Inc. that can be used at this step include HSIM®, NanoSim®, CustomSim™, VCS®, VERA®, DesignWare®, Magellan™, Formality®, ESP™ and LEDA® products. In one embodiment, the above-described primary input sensitization technique 100 can be performed in step 1214. Note that primary input sensitization technique 100 can form part of the characterization of the standard cell libraries used by the EDA tool. This characterization can occur any time after the circuits of the standard cells are available, but should be complete at least by step 1216. Therefore, technique 100 can be characterized as independent of steps 1212 and 1214.

Synthesis and design for test (step 1216): Here, the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this step include Design Compiler®, Power Compiler™, Tetramax®, and DesignWare® products.

Netlist verification (step 1218): At this step, the netlist is checked for compliance with timing constraints and for correspondence with the VHDL/Verilog source code. Exemplary EDA software products from Synopsys, Inc. that can be used at this step include Formality®, PrimeTime™, and VCS® products.

Design planning (step 1220): Here, an overall floorplan for the chip is constructed and analyzed for timing and top-level routing. Exemplary EDA software products from Synopsys, Inc. that can be used at this step include Astro™ and IC Compiler™ products.

Physical implementation (step 1222): The placement (positioning of circuit elements) and routing (connection of the same) occurs at this step. Exemplary EDA software products from Synopsys, Inc. that can be used at this step include the Astro™ and IC Compiler™ products.

Analysis and extraction (step 1224): At this step, the circuit function is verified at a transistor level, this in turn permits what-if refinement. Exemplary EDA software products from Synopsys, Inc. that can be used at this step include Astro-Rail™, PrimeRail™, Primetime®, and Star RC/XT™ products.

Physical verification (step 1226): At this step various checking functions are performed to ensure correctness for: manufacturing, electrical issues, lithographic issues, and circuitry. Exemplary EDA software products from Synopsys, Inc. that can be used at this step include the Hercules™ product.

Resolution enhancement (step 1228): This step involves geometric manipulations of the layout to improve manufacturability of the design. Exemplary EDA software products from Synopsys, Inc. that can be used at this step include Proteus™, ProteusAF™, and PSMGen™ products.

Mask data preparation (step 1230): This step provides the "tape-out" data for production of masks for lithographic use to produce finished chips. Exemplary EDA software products from Synopsys, Inc. that can be used at this step include the CATS® family of products.

The primary input sensitization technique can be implemented advantageously in one or more computer programs that execute on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors, as well as other types of micro-controllers. Generally, a processor will receive instructions and data from a read-only memory and/or a random access memory. Generally, a computer will include one or more mass storage devices for storing data files; such devices include magnetic disks, such as internal hard disks and removable disks, magneto-optical disks, and optical disks. Storage devices suitable for tangibly embodying computer program instructions and data include all forms of non-volatile memory, including by way of example semiconductor memory devices, such as EPROM, EEPROM, and flash memory devices, magnetic disks such as internal hard disks and removable disks, magneto-optical disks, and CDROM disks. Any of the foregoing can be supplemented by, or incorporated in, application-specific integrated circuits (ASICs).

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent to practitioners skilled in this art.

Figure 13:
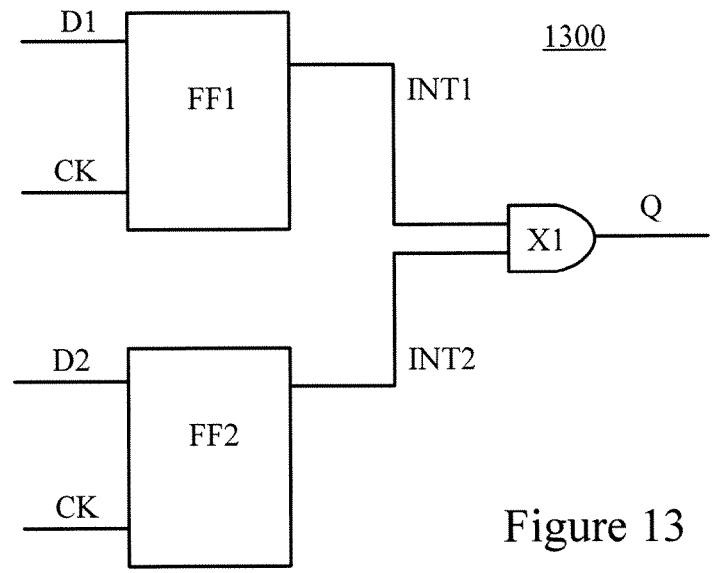
FIGS. 13 and 14 illustrate how the primary input sensitization technique can be used for different types of circuits.

For example, although sequential circuits consisting of a plurality of sequentially-connected flip-flops are described above, the primary input sensitization technique can be used for other circuits as well. FIG. 13 illustrates a circuit 1300 in which sequential outputs can propagate through combinational logic. In this embodiment, circuit 1300 includes two D-type flip-flops FF1 and FF2, which provide their outputs INT1 and INT2 to a logic (AND) gate X1. Using the above-described primary input sensitization technique, circuit 1300 can be represented as a directed graph. Then, the sensitization of its primitives, i.e. FF1, FF2, and logic gate X1, is generated and the resulting vectors are stored at the nodes representing those primitives. The following steps can be taken to express Q in terms of the primitive vectors. A primitive vector for Q (i.e. an output of an AND gate) includes:

INT1=1
INT2=01
Q=01

Inputs INT1 and INT2 can be ranked (step 701, FIG. 7) based on their last transitioning bits. This step yields the ranking of INT1, INT2. Input INT1 can be set to 1 (INT1=1) (step 702, FIG. 7) by indexing into the primitive vector table for INT1, which yields:

CK=01
D1=11
D2=00
Q=XX0

Then, INT2 can be set to transition from low to high (INT2=01) (step 702, FIG. 7) by indexing into the primitive vector table for INT2, which yields:

CK=01+01101
D1=11+(D1 kept at 1)
D2=00+00111
Q=XX0

Therefore, the final vectors stored at the Q node will be:

CK=0101101
D1=1111111
D2=0000111
Q=XX000001

Figure 14:
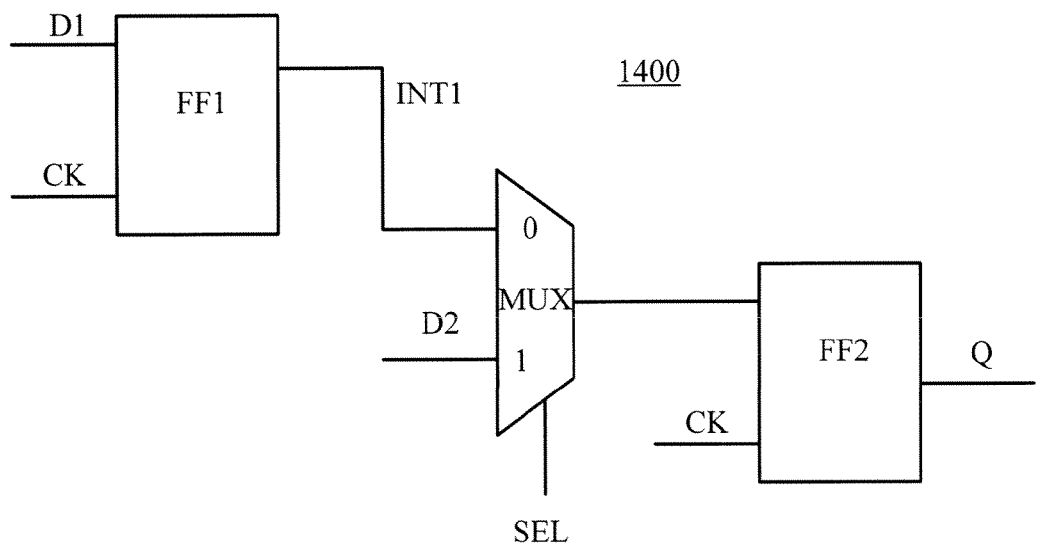

In another exemplary circuit, a constraint arc between two primary inputs may require that the internal node be set to the correct state. For example, FIG. 14 illustrates a circuit 1400 including a multiplexer MUX, which selects (using SEL) between two inputs. A first input is from a D-type flip-flop FF1 (which receives D1 as its input), and a second input is D2. A D-type flip-flop FF2 receives the output of multiplexer MUX. Therefore, in circuit 1400, the setup arc between D2 and CK requires INT1 to be set to a specific state. This state can be achieved by following the above-described primary input sensitization technique.

The primitive setup vector between D2 and CK can be as follows:

CK=011101
SEL=001111
INT1=000000
D2=000111

Then, the inputs can be ranked based on their last transitioning bits. This step yields the ranking of INT1, SEL, D2, and CK.

At this point, a vector for setting INT1 to zero can be picked. An exemplary vector for setting INT1 to zero is as follows.

CK=01

D1=00
SEL=00
D2=00
Q=XX

Note that values for SEL and D2 come from the primitive setup vector. Since the initial state of SEL and D2 in the primitive vector is logic zero, their $0^{th}$ bit in final vector is set to logic zero. After processing, INT1, SEL, and D2 from primitive vsetup vector, the rising edge (01) of CK is processed. Therefore, another transitioning clock, i.e. CK=01, corresponding to the first two bits of CK in the primitive setup vector is added to final vector. Hence, the vectors at this stage become:

CK=0101
D1=0000
SEL=0000
D2=0000
Q=XXXX0

At this stage INT1 is set to zero and since INT1 does not change state from logic zero, no further processing of INT1 is needed. Therefore, there is no change to the final vectors due to INT1.

The $2^{nd}$ bit of SEL (position 5 below) is to be set to one. Therefore, the vectors at this stage become:

CK=01011
D1=00000
SEL=00001
D2=00000
Q=XXXX00

The $2^{nd}$ bit of D2 is to be set to zero, which is provided by the current state in the vectors. Therefore, no change is necessary to the vectors.

At this point, the $3^{rd}$ bit of INT1, SEL, D2 and CK can be inspected. With the provided bits, only D2 needs to transition. Therefore, the vectors at this stage become:

CK=010111
D1=000000
SEL=000011
D2=000001
Q=XXXX000

At this point, the $4^{th}$ bits of INT1, SEL, D2 and CK can be inspected. Note that a rising transition of CK needs to be added to vector to generate the setup vector between D2 and CK when INT1=0. Therefore, the final vectors become:

CK=01011101
D1=00000000
SEL=00001111
D2=00000111
Q=XXXX00001

Those skilled in the art will recognize the applicability of the primary input sensitization technique to other types of circuits. Accordingly, it is intended that the scope of the invention be defined by the following claims and their equivalents.

The invention claimed is:

1. A method of sensitizing a sequential circuit, said sensitizing generating stimuli to drive any circuit output to a predetermined value or transition, the method comprising:
    creating a directed graph of the sequential circuit, the directed graph comprising a plurality of nodes, including primary nodes associated with primary inputs of the sequential circuit, one or more internal nodes and an output node associated with an output of the sequential circuit;
    topologically sorting the plurality of nodes of the directed graph to generate sorted nodes, wherein said topologically sorting includes determining longest data flow distances from the primary nodes to each of the one or more internal nodes and the output node; and
    using a computer, generating final vectors for the sequential circuit based on the longest data flow distances of the sorted nodes, the final vectors expressed only by primary inputs to the sequential circuit.

2. The method of claim 1, wherein said generating the final vectors includes:
    calculating intermediate vectors for the one or more internal nodes and the output node of the directed graph.

3. The method of claim 2, wherein when a longest data flow distance of an internal node is one, then storing the intermediate vector of the internal node as the final vector of the internal node.

4. The method of claim 2, wherein when a longest data flow distance of an internal node or the output node is two and higher, then performing an iteration over input transitions of an intermediate vector associated with the internal node or the output node to determine bit sequencing of a final vector of the internal node or the output node.

5. The method of claim 4, further including replacing the intermediate vector of the internal node or the output node with the final vector of the internal node or the output node.

6. The method of claim 4, wherein said performing the iteration includes ordering inputs of the intermediate vector in ascending order based on last transitioning bits of the inputs.

7. The method of claim 1, further including breaking feedback loops in the directed graph before said topologically sorting the nodes.

8. A non-transitory, computer-readable medium storing computer-executable instructions for sensitizing a sequential circuit, said sensitizing generating stimuli to drive any circuit output to a predetermined value or transition, the instructions when executed by a computer cause the computer to execute a process comprising:
    creating a directed graph of the sequential circuit, the directed graph comprising a plurality of nodes, including primary nodes associated with primary inputs of the sequential circuit, one or more internal nodes and an output node associated with an output of the sequential circuit;
    topologically sorting the plurality of nodes of the directed graph to generate sorted nodes, wherein said topologically sorting includes determining longest data flow distances from the primary nodes to each of the one or more internal nodes and the output node; and
    generating final vectors for the sequential circuit based on the longest data flow distances of the sorted nodes, the final vectors expressed only by primary inputs to the sequential circuit.

9. The non-transitory, computer-readable medium of claim 8, wherein said generating the final vectors includes:
    calculating intermediate vectors for the one or more internal nodes and the output node of the directed graph.

10. The non-transitory, computer-readable medium of claim 9, wherein when a longest data flow distance of an internal node is one, then storing the intermediate vector of the internal node as the final vector of the internal node.

11. The non-transitory, computer-readable medium of claim 9, wherein when a longest data flow distance of an internal node or the output node is two and higher, then performing an iteration over input transitions of an intermediate vector associated with the internal node or the output node to determine bit sequencing of a final vector of the internal node or the output node.

12. The non-transitory, computer-readable medium of claim 11, further including replacing the intermediate vector of the internal node or the output node with the final vector of the internal node or the output node.

13. The non-transitory, computer-readable medium of claim 11, wherein said performing the iteration includes ordering inputs of the intermediate vector in ascending order based on last transitioning bits of the inputs.

14. The non-transitory, computer-readable medium of claim 8, further including breaking feedback loops in the directed graph before said topologically sorting the nodes.

15. An electronic design automation (EDA) tool including program instructions for sensitizing a sequential circuit, said sensitizing generating stimuli to drive any circuit output to a predetermined value or transition, said program instructions performing a process comprising:
   creating a directed graph of the sequential circuit, the directed graph comprising a plurality of nodes, including primary nodes associated with primary inputs of the sequential circuit, one or more internal nodes and an output node associated with an output of the sequential circuit;
   topologically sorting the plurality of nodes of the directed graph to generate sorted nodes, wherein said topologically sorting includes determining longest data flow distances from the primary nodes to each of the one or more internal nodes and the output node; and
   generating final vectors for the sequential circuit based on the longest data flow distances of the sorted nodes, the final vectors expressed only by primary inputs to the sequential circuit,
   wherein the process is performed by a computer.

16. The EDA tool of claim 15, wherein said generating the final vectors includes:
   calculating intermediate vectors for the one or more internal nodes and the output node of the directed graph.

17. The EDA tool of claim 16, wherein when a longest data flow distance of an internal node is one, then storing the intermediate vector of the internal node as the final vector of the internal node.

18. The EDA tool of claim 16, wherein when a longest data flow distance of an internal node or the output node is two and higher, then performing an iteration over input transitions of an intermediate vector associated with the internal node or the output node to determine bit sequencing of a final vector of the internal node or the output node.

19. The EDA tool of claim 18, further including replacing the intermediate vector of the internal node or the output node with the final vector of the internal node or the output node.

20. The EDA tool of claim 18, wherein said performing the iteration includes ordering inputs of the intermediate vector in ascending order based on last transitioning bits of the inputs.

21. The EDA tool of claim 15, further including breaking feedback loops in the directed graph before said topologically sorting the nodes.

22. A method of sensitizing a sequential circuit, said sensitizing generating stimuli to drive any circuit output to a predetermined value or transition, the method comprising:
   creating a directed graph of the sequential circuit;
   topologically sorting nodes of the directed graph to generate sorted nodes, wherein said topologically sorting includes determining a level for each node; and
   using a computer, generating final vectors for the sequential circuit based on the sorted nodes, the final vectors expressed only by primary inputs to the sequential circuit,
   wherein generating the final vectors includes:
      storing intermediate vectors for the nodes of the directed graph, wherein at least one intermediate vector is expressed by an internal node; and
      performing an iteration between input transitions to determine bit sequencing over each intermediate vector of a node of node level two and higher.

23. The method of claim 22, further including replacing stored intermediate vectors with the final vectors, which were computed based on the iteration.

24. The method of claim 22, wherein said performing the iteration includes ordering inputs in ascending order based on last transitioning bits.

25. A non-transitory, computer-readable medium storing computer-executable instructions for sensitizing a sequential circuit, said sensitizing generating stimuli to drive any circuit output to a predetermined value or transition, the instructions when executed by a computer cause the computer to execute a process comprising:
   creating a directed graph of the sequential circuit;
   topologically sorting nodes of the directed graph to generate sorted nodes, wherein said topologically sorting includes determining a level for each node; and
   generating final vectors for the sequential circuit based on the sorted nodes, the final vectors expressed only by primary inputs to the sequential circuit,
   wherein generating the final vectors includes:
      storing intermediate vectors for the nodes of the directed graph, wherein at least one intermediate vector is expressed by an internal node; and
      performing an iteration between input transitions to determine bit sequencing over each intermediate vector of a node of node level two and higher.

26. The non-transitory, computer-readable medium of claim 25, further including replacing stored intermediate vectors with the final vectors, which were computed based on the iteration.

27. The non-transitory, computer-readable medium of claim 25, wherein said performing the iteration includes ordering inputs in ascending order based on last transitioning bits.

28. An electronic design automation (EDA) tool including program instructions for sensitizing a sequential circuit, said sensitizing generating stimuli to drive any circuit output to a predetermined value or transition, said program instructions performing a process comprising:
   creating a directed graph of the sequential circuit;
   topologically sorting nodes of the directed graph to generate sorted nodes, wherein said topologically sorting includes determining a level for each node; and
   generating final vectors for the sequential circuit based on the sorted nodes, the final vectors expressed only by primary inputs to the sequential circuit,
   wherein generating the final vectors includes:
      storing intermediate vectors for the nodes of the directed graph, wherein at least one intermediate vector is expressed by an internal node; and
      performing an iteration between input transitions to determine bit sequencing over each intermediate vector of a node of node level two and higher, wherein the process is performed by a computer.

29. The EDA tool of claim 28, further including replacing stored intermediate vectors with the final vectors, which were computed based on the iteration.

30. The EDA tool of claim 28, wherein said performing the iteration includes ordering inputs in ascending order based on last transitioning bits.

\* \* \* \* \*